United States Patent [19]

Kawachi et al.

[11] Patent Number: 5,441,619
[45] Date of Patent: Aug. 15, 1995

[54] ELECTROPLATING APPARATUS

[75] Inventors: Norio Kawachi, Hiratsuka; Midori Ito, Tokyo; Toshiharu Naka, Abiko; Hidenori Tsuji, Fujisawa, all of Japan

[73] Assignee: Ebara-Udylite Co., Ltd., Japan

[21] Appl. No.: 163,069

[22] Filed: Dec. 6, 1993

[30] Foreign Application Priority Data

Dec. 7, 1992 [JP] Japan ................... 4-351141
Nov. 26, 1993 [JP] Japan ................... 5-319237

[51] Int. Cl.⁶ ............................................ C25D 17/00
[52] U.S. Cl. ............................. 204/206; 204/224 R; 204/269; 204/237
[58] Field of Search .......... 204/224 R, 206, 207–211, 204/269, 237

[56] References Cited

U.S. PATENT DOCUMENTS

| | | | |
|---|---|---|---|
| 3,900,383 | 8/1975 | Austin et al. | 204/211 |
| 4,155,815 | 5/1979 | Francis et al. | 204/224 R X |
| 4,871,435 | 10/1989 | Denofrio | 204/224 R |
| 4,986,888 | 1/1991 | Hosten et al. | 204/224 R X |

FOREIGN PATENT DOCUMENTS 471577 2/1992 European Pat. Off. .

*Primary Examiner*—Donald R. Valentine
*Attorney, Agent, or Firm*—Lerner, David, Littenberg, Krumholz & Mentlik

[57] ABSTRACT

An electroplating apparatus capable of forming a film of a uniform thickness on a substrate for printed wiring irrespective of a size of the substrate. Insoluble anode plates are arranged in a plurality of pairs in an electroplating tank in a manner to be juxtaposed to each other along a transfer passage along which the substrate is horizontally transferred and electrically independent from each other for every pair. The insoluble anode plates in each pair are arranged so as to be vertically spaced from each other with the transfer passage being interposed therebetween and are independently connected to an anode terminal of each of rectifiers. Cathode terminals of the rectifiers are electrically connected together to clips for holding the substrate. Electroplating on the substrate is carried out by feeding only the insoluble anode plates contained in a plane of projection of the substrate defined in a vertical direction of the substrate with electricity.

17 Claims, 8 Drawing Sheets

ELECTROPLATING APPARATUS

BACKGROUND OF THE INVENTION

This invention relates to an electroplating apparatus, and more particularly to an electroplating apparatus of the continuous traveling type for electroplating a thin sheet such as a substrate for printed wiring or the like.

Recently, copper electroplating has been widely carried out on a substrate for printed wiring (hereinafter referred to as "substrate"). A conventional electroplating apparatus for such copper electroplating is constructed in such a manner that a substrate acting as a cathode is immersed in an electroplating solution received in an electroplating tank in which a soluble copper anode means is arranged. Then, the electroplating apparatus is turned on, resulting in copper electroplating being carried out on the substrate.

However, the conventional electroplating apparatus requires to successively replenish the copper anode means, because it is gradually consumed due to electrochemical dissolution with advance of the electroplating. Unfortunately, such replenishment is highly troublesome and dangerous to an operator.

Also, copper plates used for the copper anode means in the conventional electroplating apparatus is limited to a predetermined size, therefore, it is substantially impossible to vary an area of the anode means depending on a size of a substrate to be electroplated. Thus, an increase in area of the anode means relative to that of the substrate causes a thickness of a film electroplated on a peripheral portion of the substrate to be excessively increased and that at a central region thereof to be excessively decreased. This leads to a failure in formation of a film having a satisfactory uniform thickness which is required on the substrate, resulting in failing to provide the substrate with satisfactory quality.

SUMMARY OF THE INVENTION

The present invention has been made in view of the foregoing disadvantage of the prior art.

Accordingly, it is an object of the present invention to provide an electroplating apparatus which is capable of adjusting, depending on a size of a thin sheet, an area of insoluble anode plates which is to be supplied with electricity for electroplating, to thereby coat the thin sheet with a film of a uniform thickness by electroplating irrespective of a size of the thin sheet.

It is another object of the present invention to provide an electroplating apparatus which is capable of facilitating maintenance of a metal concentration in an electroplating solution.

It is a further object of the present invention to provide an electroplating apparatus which is capable of exhibiting satisfactory throwing power.

In accordance with the present invention, an electroplating apparatus is provided. The electroplating apparatus includes an electroplating tank in which an electroplating solution is received and a transfer passage is defined, a transfer means for transferring a thin sheet to be electroplated along the transfer passage in the electroplating tank, and insoluble anode plates arranged in a plurality of pairs in the electroplating tank so as to extend along the transfer passage. The insoluble anode plates in each pair are arranged so as to be spaced from each other at a predetermined interval with the transfer passage being interposed therebetween. The insoluble anode plates in pairs are arranged so as to be electrically independent from each other for every pair. The insoluble anode plates in pairs are juxtaposed to each other in a direction perpendicular to the transfer passage and so as to be in parallel to the transfer passage. The electroplating apparatus further includes an electricity feeding means for feeding said insoluble anode plates in pairs with electricity independently for every pair and an electrical connection means for electrically connecting the thin sheet to said electricity feeding means, whereby electroplating on the thin sheet is carried out by feeding, with electricity, only the insoluble anode plates in pairs contained in a plane of projection of the thin sheet defined in a direction perpendicular to a surface of the thin sheet being transferred.

In the electroplating apparatus of the present invention constructed as described above, the thin sheet or substrate to be electroplated is transferred in the electroplating solution while being kept horizontal or vertical, during which only the insoluble anode plates in pairs contained in a plane of projection of the substrate defined in a direction perpendicular to a surface of the substrate is fed with electricity, resulting in a film of a uniform thickness being deposited on the substrate. Thus, the present invention permits an area of the insoluble anode plates which is to be fed with electricity to be adjusted depending on a size of a substrate, to thereby ensure electroplating of a film of a uniform thickness on the substrate irrespective of a size of the substrate. Also, use of the insoluble anode plates in the present invention permits a decrease in concentration of metal ingredients in the electroplating solution to be readily compensated by merely charging soluble salts of the metal ingredients in the solution.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, in which like reference numerals designate like or corresponding parts throughout; wherein.

DETAILED DESCRIPTION OF THE PREFERRED EMBODIMENTS

Now, an electroplating apparatus according to the present invention will be described hereinafter with reference to the accompanying drawings.

Figure 1:
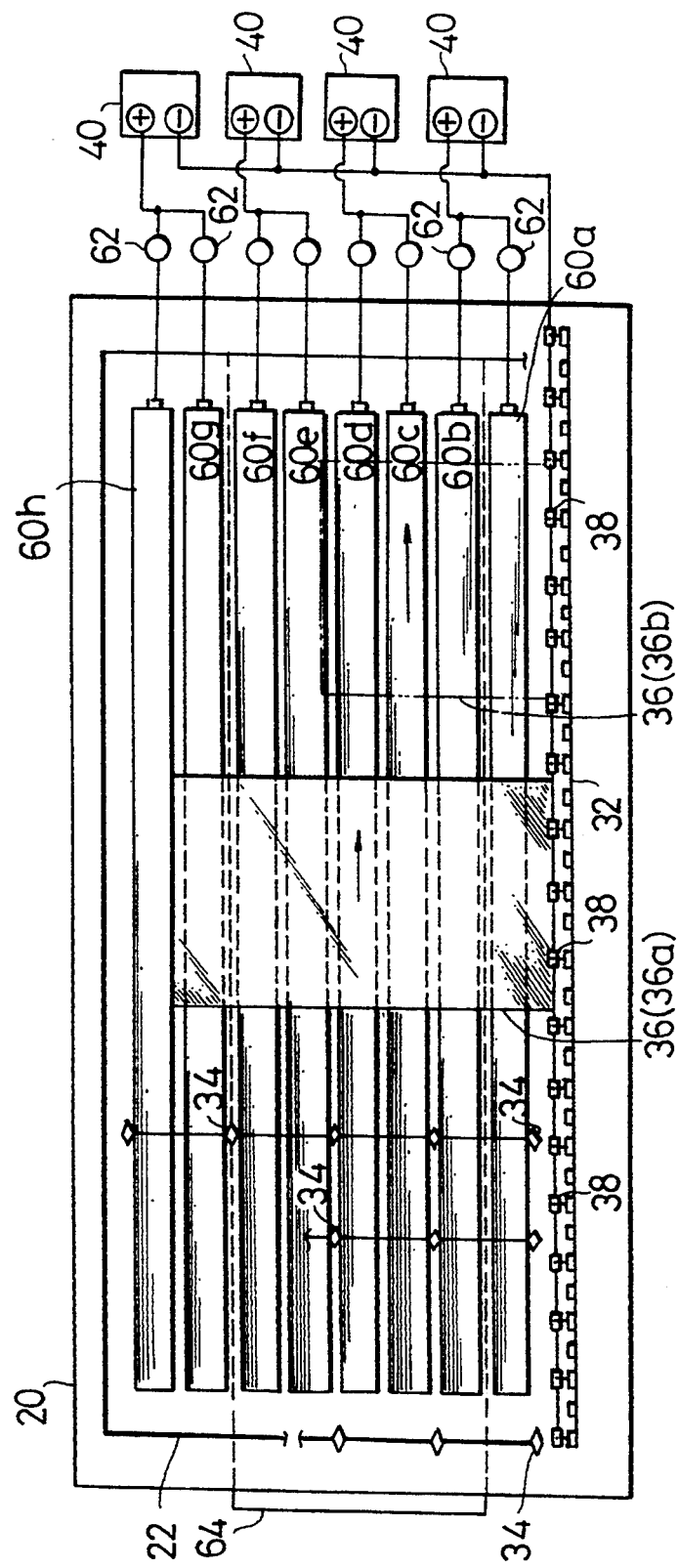
FIG. 1 is a plan view showing an embodiment of an electroplating apparatus according to the present invention.
Figure 2:
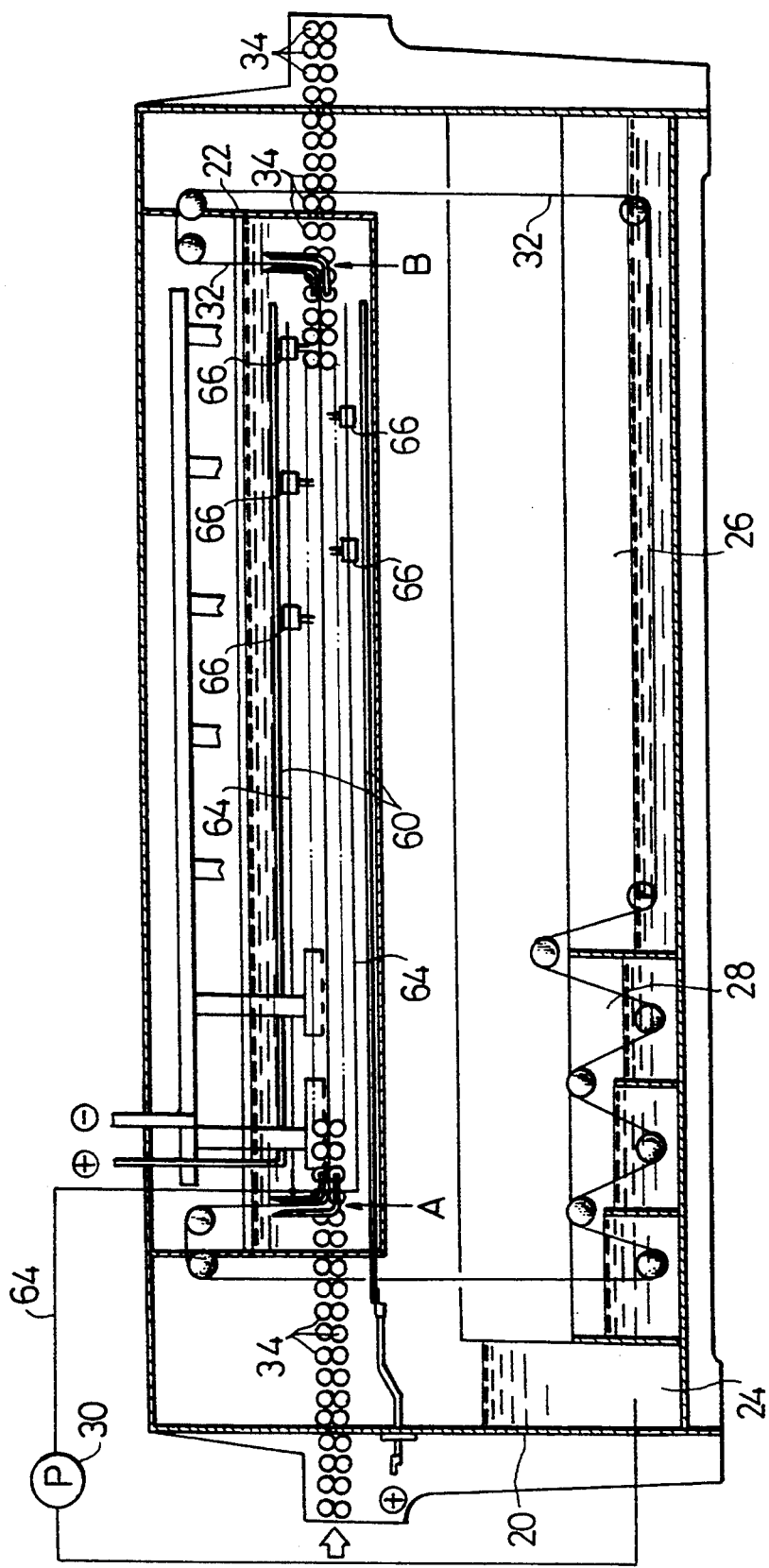
FIG. 2 is a front elevation view in section of the electroplating apparatus shown in FIG. 1.

Referring first to FIGS. 1 to 4, an embodiment of an electroplating apparatus according to the present invention is illustrated. An electroplating apparatus of the illustrated embodiment, as shown in FIGS. 1 and 2, includes an outer tank 20, in which an upper electroplating tank 22 and a lower receiver tank 24 are arranged in a manner to be vertically separated from each other. Also, the outer tank 20 is provided therein with a peeling tank 26 and a water washing tank 28 so as to be positioned laterally of the receiver tank 24 and separated from each other. The electroplating tank 22 and receiver tank 24 each are adapted to store or receive an electroplating solution therein. The electroplating solution is fed from the receiver tank 24 to the electroplating tank 22 by means of a circulation pump 30 equipped with a cartridge filter (not shown) and then returned from the electroplating tank 22 to the receiver tank 24 due to overflow from the tank 22, resulting in being circulated between both tanks 22 and 24. The peeling tank 26 and water washing tank 28 are charged therein with a peeling solution and washing water, respectively. Reference numeral 32 designates an endless conductive chain which is arranged so as to travel in the electroplating tank 22, peeling tank 26 and water washing tank 28 in turn.

The electroplating tank 22 is provided therein with conveyor rolls 34 in a plurality of pairs each of which comprises two conveyor rolls 34 arranged so as to be vertically opposite to each other. The conveyor rolls 34 in pairs are arranged in a horizontal direction as shown in FIG. 2. The endless conductive chain 32 is arranged in the electroplating tank 22 so as to travel on one of both side ends of each of the rolls 34. The conveyor rolls 34 in each pair arranged vertically opposite to each other are rotated in directions opposite to each other by means of a drive unit (not shown), so that substrates 36 (36a, 36b- - -) are transferred between the rolls 4 in a direction indicated at an arrow in FIG. 1 while being kept horizontal.

The endless conductive chain 32 is provided thereon with a plurality of clips 38 at predetermined intervals, which clips 38 are arranged on the chain 32 so as to successively travel in the electroplating tank 22, peeling tank 26 and water washing tank 28. The endless conductive chain 32 is driven through the drive unit (not shown) operatively connected thereto and is electrically connected to a cathode terminal of each of rectifiers 40. The endless conductive chain 32 travels in the electroplating tank 22, peeling tank 26 and water washing tank 28 in turn as described above, so that a material electroplated on the conductive chain 32 in the electroplating tank 22 is peeled in the peeling tank 26 and then the chain 32 is subject to water washing in the water washing tank 28.

Figure 3:
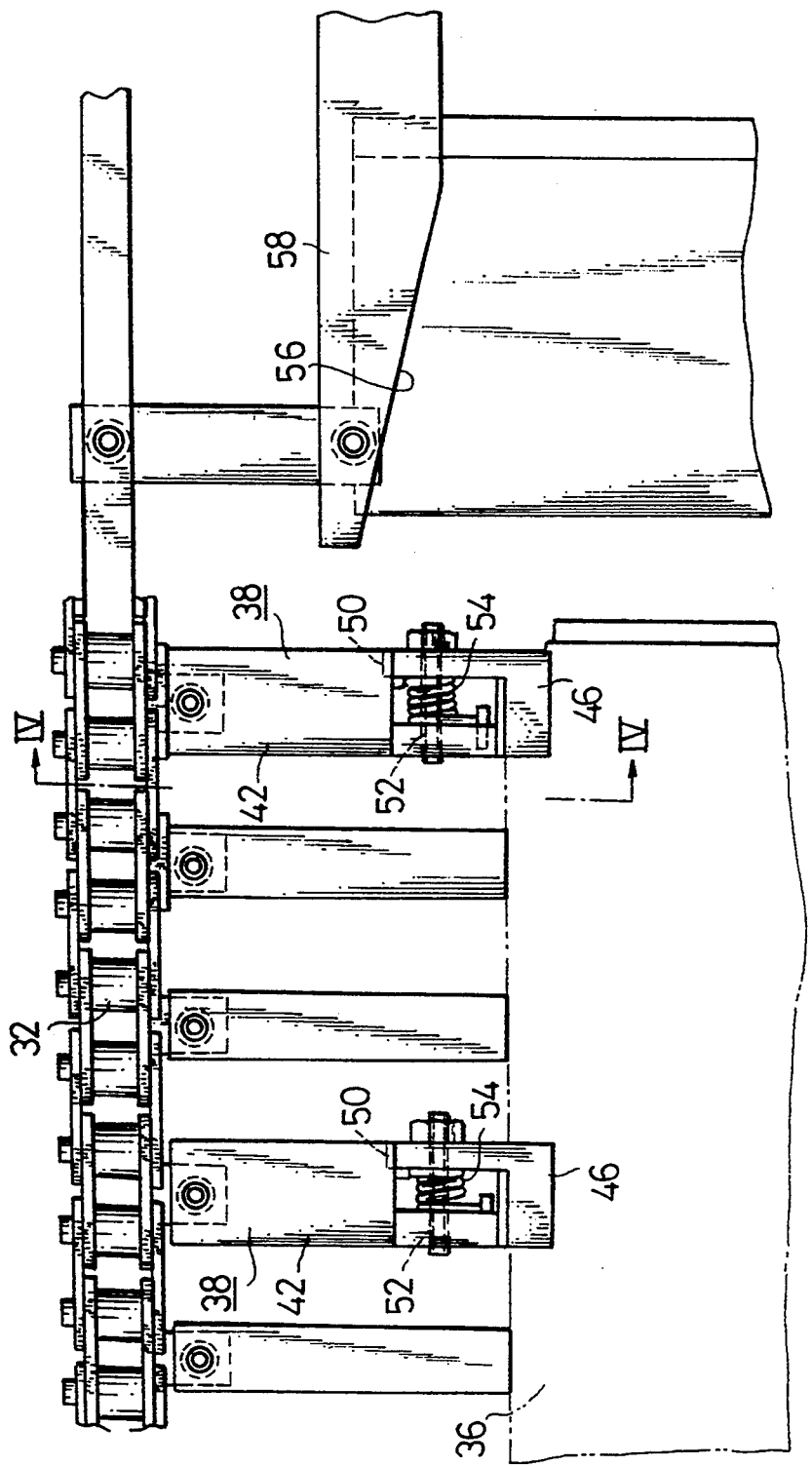
FIG. 3 is a fragmentary enlarged plan view of the electroplating apparatus shown in FIG. 1.
Figure 4:
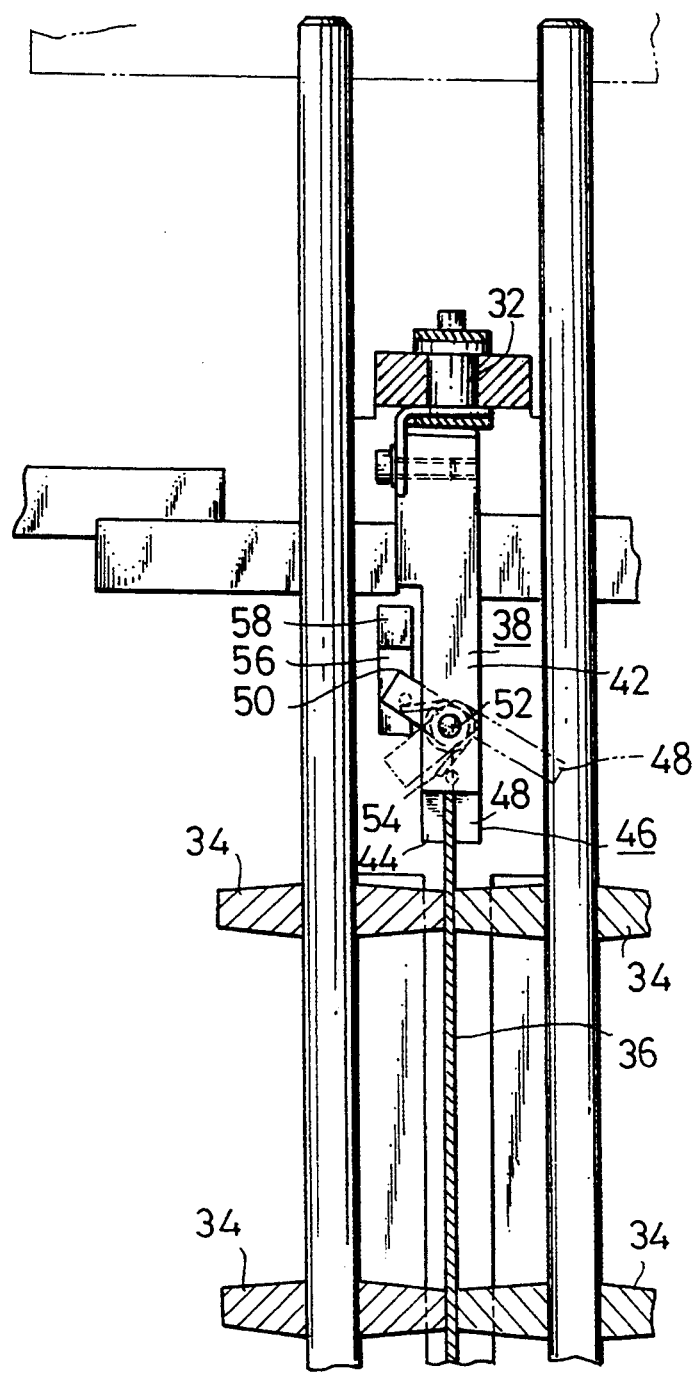
FIG. 4 is a sectional view taken along line IV—IV of FIG. 3.
Figure 5:
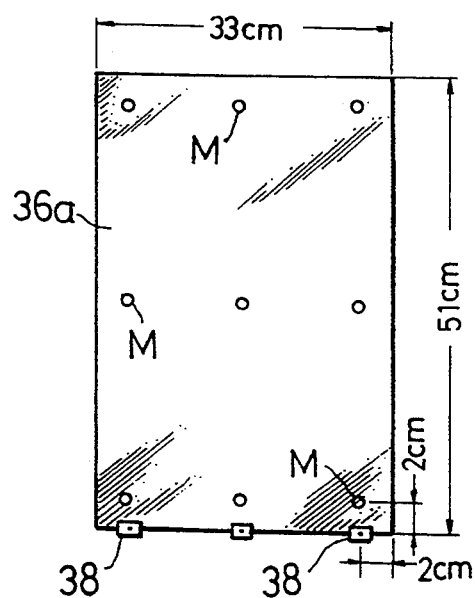
FIG. 5 is a plan view showing an example of a substrate electroplated in the electroplating apparatus of FIG. 1.
Figure 6:
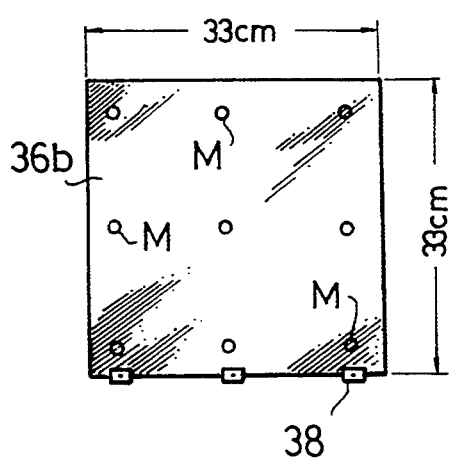
FIG. 6 is a plan view showing another example of a substrate electroplated in the electroplating apparatus of FIG. 1.
Figure 7:
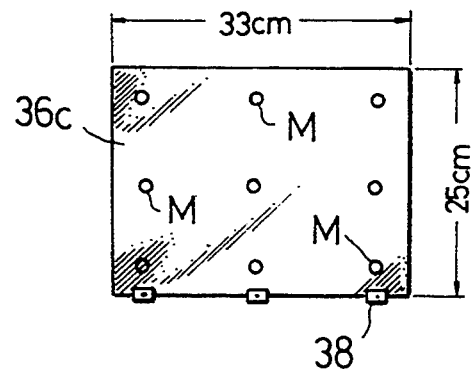
FIG. 7 is a plan view showing a further example of a substrate electroplated in the electroplating apparatus of FIG. 1.

The clips 38, as shown in FIGS. 3 and 4, each include a clip body 42 formed with a clamp section 44 and a clamp element 46 of a substantially doglegged shape formed at an end thereof with both a clamp section 48 and an abutment section 50. The clamp element 46 is pivotally mounted on the clip body 42 by means of a support shaft 52. Also, the clips 38 each include a spring 54 fittedly arranged on the support shaft 52 for urging the clamp element 46 in a direction of permitting the clamp section 48 of the clamp element 46 to be abutted against the clamp section 44 of the clip body 42.

The clip body 42 is electrically connected to the endless conductive chain 32, so that the clip body 42 and clamp element 46 are electrically connected through the conductive chain 32 to the cathode terminal of each of the rectifiers 40 described above. The clamp element 46 is so formed that the abutment section 50 is slidable with respect to a cam surface 56 of a cam member 58. Thus, when the endless conductive chain 32 travels, the abutment section 50 of the clamp element 46 is abutted against the cam surface 56 of the cam member 58, so that the clamp element 46 may be pivotally moved against elastic force of the spring 54. The cam member 58 is disposed at each of both ends of the electroplating tank 22 defined in the direction of transfer of the substrate 36 described above, as indicated at reference characters A and B in FIG. 2. Each of the clips 38 is adapted to interposedly hold the substrate 36 at the position A, to thereby be kept electrically connected to the substrate 36 while keeping the clamp section 48 of the clamp element 46 closely contacted with the clamp section 44 of the clip body 42, resulting in being closed as indicated at solid lines in FIG. 4; Whereas, at the position B, the abutment section 50 of the clamp element 46 is engaged with the cam member 45 to space the clamp section 48 from the clip body 42, resulting in the clip 38 being open as indicated at phantom lines in FIG. 4, so that the substrate 36 may be released therefrom.

Further, the electroplating tank 22 is provided therein with insoluble anode plates 60 in pairs, which are horizontally arranged in the direction of transfer of the substrate 36. In the illustrated embodiment, eight pairs of such anode plates $60a$ to $60_h$ are juxtaposed to each other in a direction perpendicular to the direction of transfer of the substrate as shown in FIG. 1. Each pair of anode plates 60 are arranged so as to vertically opposite to each other at a predetermined interval with the rolls 4 being interposed therebetween. The insoluble anode plates 60 each are formed into a width of 1 to 20 cm and a suitable length. Each adjacent two pairs of insoluble anode plates 60 are insulated from each other. The insoluble anode plates 60 each are made of a metal base coated with a material selected from the group consisting of platinum, carbon, ferrite, and an oxide of platinum metal such as iridium or the like. An inlet of the electroplating tank 22 and an outlet thereof through which the substrate is accessible to the electroplating tank 22 each are provided with a seal structure. Such a seal structure is widely known in the art. Therefore, in the illustrated embodiment, more detailed description on the seal structure will be eliminated.

The rectifiers 40 each are adapted to provide a voltage and a current which are sufficient to permit desired electroplating to be carried out. The rectifiers 40 each are connected at an anode terminal thereof to the insoluble anode plates 60 in each pair. Alternatively, the rectifiers 40, as shown in FIG. 1, each may be connected at the anode terminal thereof through voltage/current regulators 62 to the insoluble anode plates 60 in two or more pairs. Cathodes of the rectifiers 40 are commonly connected to a feed contact through which the substrate 36 being transferred is fed with electricity. In the illustrated embodiment, the feed contact comprises the clips 38 each acting to interposedly hold one side end of the substrate 36 through the endless conductive chain 32. Alternatively, it may comprise round rolls made of metal which are adapted to be contacted with a surface of the substrate 36.

The circulation pump 30 is connected on an outlet side thereof to a discharge pipe 64, which is provided with a jet nozzle 66 for ejecting the electroplating solution on both upper and lower sides of the substrate to stir the electroplating solution in the electroplating tank 22, so that throwing power may be increased to improve electroplating with respect to through-holes of the substrate 36. The electroplating solution may be ejected on any one of both upper and lower sides of the substrate.

Now, the manner of operation of the electroplating apparatus of the illustrated embodiment constructed as described above will be described hereinafter with reference to FIGS. 1 to 4.

The substrate 36a (FIG. 1) which was previously subject to a desired pretreatment is horizontally transferred in the electroplating solution in the electroplating tank 22 by means of the conveyor rolls 34 in pairs while being interposedly held at one of both side ends thereof defined in the direction of transfer of the substrate by the clips 38, to thereby be kept electrically connected to the cathode terminals of the rectifiers 40. At this time, of eight pairs of the insoluble anode plates 60a to 60h, the insoluble anode plates 60a to 60h in pairs contained in a projection plane of the substrate 36a defined in the vertical direction as shown in FIG. 1 are fed with electricity, so that a film of a uniform thickness may be electroplated on the substrate 36a. Also, electroplating on the substrate 36b having an area smaller than the substrate 36a which is indicated at phantom lines in FIG. 1 is carried out by feeding electricity to only five pairs of insulating anode plates 60a to 60e contained in a projection plane of the substrate 36b, resulting in a film electroplated on the substrate 36b being provided with a significantly uniform thickness.

It is convenient that feeding to the insoluble anode plates 60 is automatically carried out using a signal obtained by automatically detecting a size of the substrates 36 by means of any suitable electric or optical means.

FIG. 1 shows electroplating on the substrate 36a of a large size and that of a small size for convenience sake. In general, a predetermined number of substrates of the same size for each lot are fed to the electroplating apparatus.

A decrease in concentration of a metal ingredient such as, for example, copper in the electroplating solution with progress of electroplating is compensated by charging a soluble salt of the metal such as, for example, a copper salt in the electroplating solution received in the receiver tank 24 arranged in a circulation path of the electroplating solution, resulting in a concentration of the metal ingredient in the electroplating solution being kept constant. It is desirable that adjustment of concentration of each of ingredients in the electroplating solution is automatically carried out through a combination of automatic analytical instrument and an automatic replenishing instrument.

Now, the illustrated embodiment will be further described hereinafter with reference to the following experimental examples and comparative examples.

Experimental Example 1

Sixteen insoluble anode plates 60 each made by applying iridium oxide to a titanium plate of 5 cm in width and 120 cm in length by baking were prepared for an electroplating apparatus constructed in such a manner as shown in FIGS. 1 and 2. Of sixteen anode plates 60, eight insoluble anode plates 60a to 60h were arranged on each of both upper and lower sides of conveyor rolls 34 in pairs and in a direction perpendicular to a direction of transfer of substrates 36 in a manner to be vertically spaced by a distance of 12 cm from a center between the conveyor rolls 34 in each pair. Each adjacent two of the insoluble anode plates 60a to 60h thus arranged in the direction perpendicular to the direction of transfer of the substrates 36 are juxtaposed to each other so as to be horizontally spaced from each other at an interval of 1 cm. In the insoluble anode plates 60 thus arranged, each two anode plates vertically opposite to each other constitute one set and are electrically connected through a voltage/current regulator 62 to an anode terminal of each of rectifiers 40.

An electroplating solution of the following composition was prepared.

| | |
|---|---|
| Copper sulfate (CuSO$_4$.5H$_2$O) | 65 g/l |
| Sulfuric acid (H$_2$SO$_4$) | 180 g/l |
| Chlorine ion (Cl$^-$) | 60 mg/l |
| Brightener | 5 ml/l |
| (CuBrite TH manufactured by EBARA-UDYLITE CO., LTD.) | | an electroplating tank 22 so that a level of the solution reaches a distance of 5 cm above the upper one of the insoluble anode plates 7 in each pair.

Three kinds of substrates 36a, 36b and 36c having a copper foil applied to each of both surfaces thereof were prepared. The substrates 36a to 36c are formed into sizes of 33 cm×51 cm, 33 cm×33 cm, and 33 cm×25 cm, respectively. The substrates each were interposedly held at one side end thereof (length: 33 cm) by three conductive clips, resulting in being electrically connected to a cathode terminal of each of the rectifiers 40. Then, the substrates were subject to electroplating for 10 minutes while being horizontally transferred at an average speed of 10 cm/min. Feeding of electricity to the electroplating apparatus was as shown in Table 1. The feeding was varied depending on a size of the substrate. More particularly, the feeding to the substrate 36a was uniformly carried out with respect to all the insoluble anode plates 60a to 60h, that to the substrate 36b was carried out five pairs of insoluble anode plates 60a to 60e, and that to the substrate 36c was carried out with respect to four pairs of insoluble anode plates 60a to 60d.

An average current density of the cathode (substrate 36) was set to be 2.5 A/dm$^2$. A temperature of the electroplating solution was kept at 23±2° C. and stirring of the solution was carried out by ejecting and circulating the electroplating solution from a jet nozzle 66 mounted on a discharge pipe 64 in a direction perpendicular to a surface of the substrate by means of a circulation pump 30.

Upon completion of the electroplating, a thickness of a film electroplated on each of the substrates was measured at 18 points M on front and lower surfaces of the substrate. More particularly, each three points were defined on a first end of the substrate held by the clips 38, a second end thereof opposite to the first end, and a central region thereof between the first end and the second end. An average film thickness on each of the first and second ends and central region of the substrate was obtained. Also, scattering of a film thickness on each of both first and second ends of the substrate was obtained on the basis of a film thickness on the central region of the substrate. The results were as shown in Table 1. Table 1 indicates that the film thickness on each of both ends of the substrate was 1.1 to 1.3 times as large as that on the central region, thus, the film plated on the substrate exhibited satisfactory quality. Also, the plated film had a uniform appearance and exhibited good properties.

Comparative Example 1

The substrates 36b and 36c were subject to electroplating while keeping an average current density of the substrate at 2.5 A/dm$^2$ and applying a voltage of the same level to all the insoluble anode plates 60a to 60h according to a conventional procedure. The results were as shown in Table 1. A film thickness plated on a second end of the substrate opposite to a first end thereof held by the clips 38 was 2.3 times or more as large as that on a central region thereof, leading to a failure to permit the film to exhibit satisfactory quality. Also, the film of the thus increased thickness deposited on the end of the substrate was substantially coarse to a degree sufficient to cause properties of the film to be highly deteriorated.

Upon completion of the electroplating, a thickness of a film plated on each of substrates was measured at 18 points M on front and lower surfaces of the substrate as in Experimental Example 1. An average film thickness on each of first and second ends and a central region of the substrate was obtained. The results were as shown in Table 2. Table 2 indicates that the film thickness on each of both first and second ends of the substrate was about 1.15 to 1.3 times as large as that on the central region, thus, the film plated on the substrate exhibited satisfactory quality. Also, the plated film had a uniform appearance and exhibited good properties.

Comparative Example 2

Electroplating on each of substrates 36b and 36c was carried out for 10 minutes according to the conventional procedure under conditions shown in Table 2 while keeping an average current density of a cathode (substrate) at 4.0 A/dm$^2$ as in Experimental Example 2.

The results were as shown in Table 2. More particularly, a film thickness plated on a second end of the substrate opposite to a first end held by clips 38 was 1.9 to 2.5 times as large as that on a central region thereof, to thereby fail to permit the film to exhibit satisfactory quality. Also, the film deposited on each of the ends of

TABLE 1

| Substrate (Plating Area) (dm$^2$) | Example | Anode Fed | Feed Conditions for Plating | | | Thickness of Film | | | Ratio of (b)/(a) |
|---|---|---|---|---|---|---|---|---|---|
| | | | Current per Pair of Vertically Adjacent Anodes (Amp) | Electricity Fed to Substrate (Amp) | Average Cathode Current Density (A/dm$^2$) | First End(a) ($\mu$) | Center ($\mu$) | Second End(b) ($\mu$) | |
| 36a (16.8) | Exp. Example 1 | 60a —60h | 10.5 | 84.0 | 2.5 | 5.4 | 4.3 | 5.2 | 1.21 |
| | Comp. Example 1 | — | — | — | — | — | — | — | — |
| 36b (10.9) | Exp. Example 1 | 60a —60e | 10.9 | 54.5 | 2.5 | 5.4 | 4.2 | 5.1 | 1.21 |
| | Comp. Example 1 | 60a —60h | 6.8 | 54.5 | 2.5 | 5.2 | 4.0 | 9.4 | 2.35 |
| 36c (8.3) | Exp. Example 1 | 60a —60d | 10.3 | 41.3 | 2.5 | 5.5 | 4.4 | 5.0 | 1.14 |
| | Comp. Example 1 | 60a —60h | 5.3 | 41.3 | 2.5 | 5.4 | 4.2 | 11.1 | 2.64 |

Experimental Example 2

Experimental Example 1 was substantially repeated except that an average current density of a substrate was set to be 4.0 A/dm$^2$ and conditions shown in Table 2 were employed, so that electroplating was carried out for 10 minutes.

the substrate was substantially coarse to a degree sufficient to cause an appearance and properties of the film to be highly deteriorated.

TABLE 2

| Substrate (Plating Area) (dm$^2$) | Example | Anode Fed | Feed Conditions for Plating | | | Thickness of Film | | | Ratio of (b)/(a) |
|---|---|---|---|---|---|---|---|---|---|
| | | | Current per Pair of Vertically Adjacent Anodes (Amp) | Electricity Fed to Substrate (Amp) | Average Cathode Current Density (A/dm$^2$) | First End(a) ($\mu$) | Center ($\mu$) | Second End(b) ($\mu$) | |
| 36a (16.8) | Exp. Example 2 | 60a —60h | 16.8 | 135 | 4.0 | 8.8 | 6.9 | 8.3 | 1.20 |
| | Comp. Example 2 | — | — | — | — | — | — | — | — |
| 36b (10.9) | Exp. Example 2 | 60a —60e | 17.4 | 87 | 4.0 | 8.8 | 6.7 | 8.0 | 1.19 |
| | Comp. Example 2 | 60a —60h | 10.9 | 87 | 4.0 | 8.3 | 7.3 | 13.8 | 1.89 |
| 36c (8.3) | Exp. Example 2 | 60a —60d | 16.5 | 66 | 4.0 | 8.6 | 6.5 | 8.0 | 1.23 |
| | Comp. Example 2 | 60a —60h | 8.3 | 66 | 4.0 | 8.1 | 7.1 | 17.8 | 2.51 |

Figure 8:
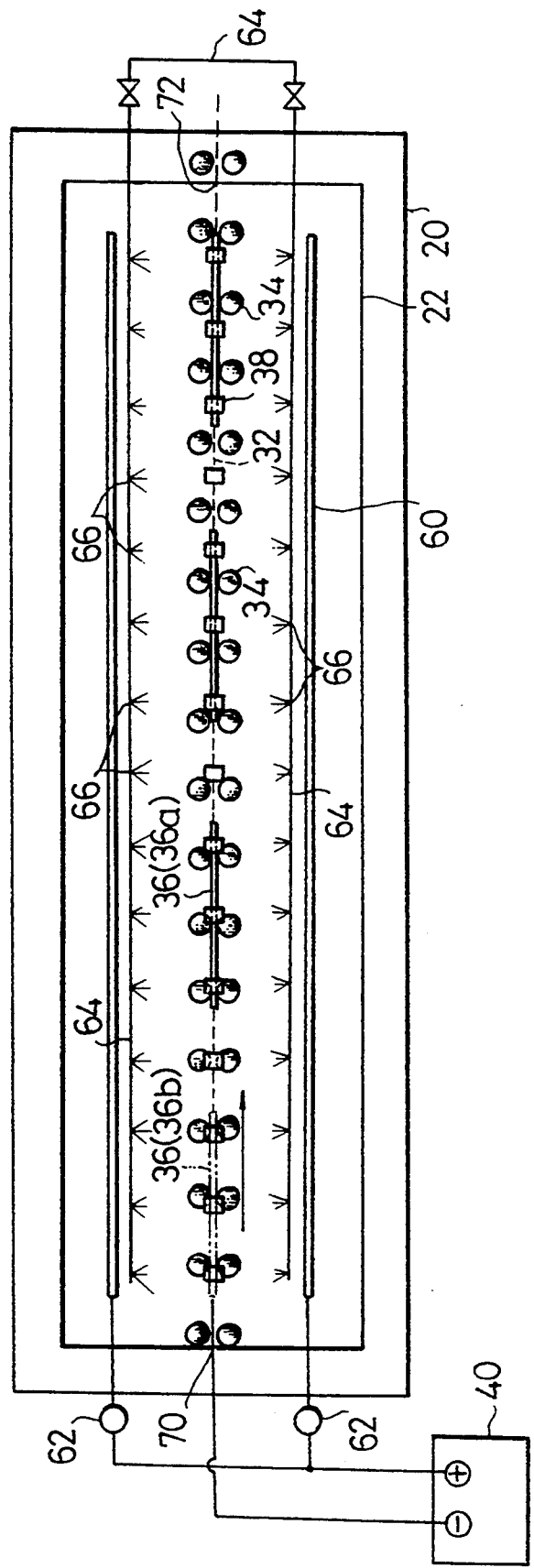
FIG. 8 is a plan view showing another embodiment of an electroplating apparatus according to the present invention.
Figure 9:
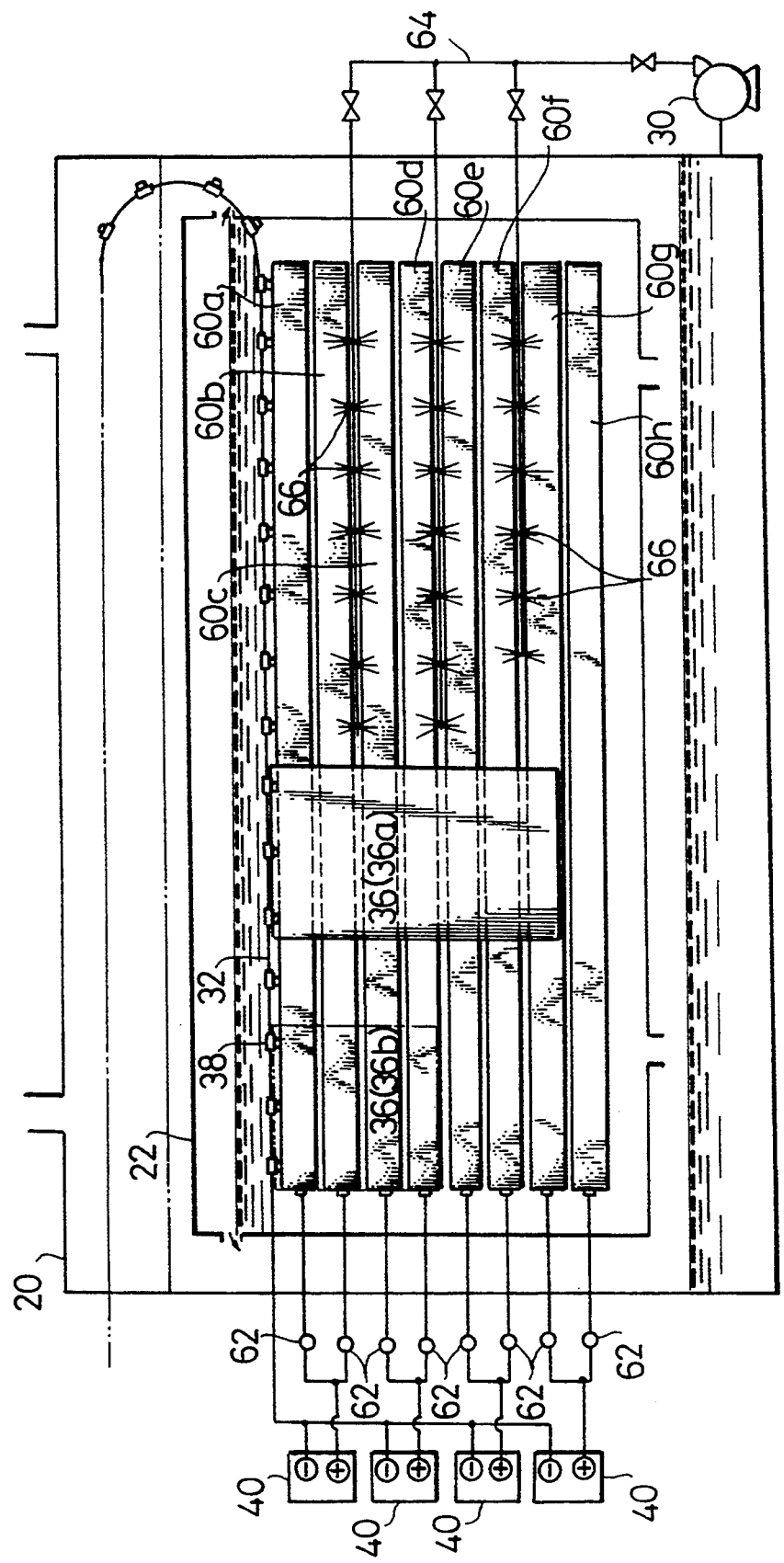
FIG. 9 is a front elevation view in section of the electroplating apparatus shown in FIG. 8.
Figure 10:
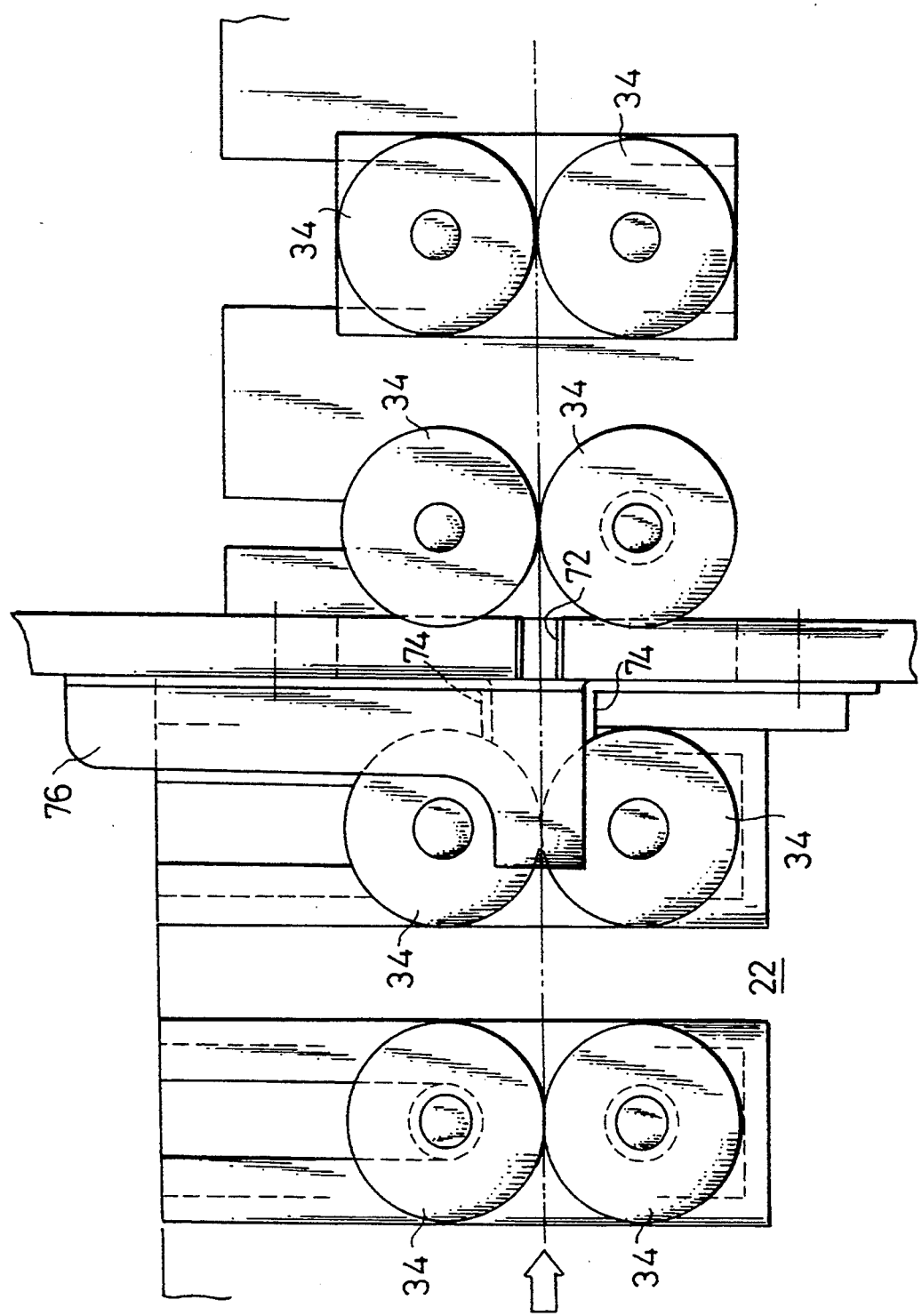
FIG. 10 is a fragmentary enlarged plan view of the electroplating apparatus shown in FIG. 8.

Referring now to FIGS. 8 to 10, another embodiment of an electroplating apparatus according to the present invention is illustrated.

An electroplating apparatus of the illustrated embodiment is so constructed that a substrate 36 is transferred by clips 38 mounted on an endless conductive chain 32 while being kept hung from the clips 38 and rolls 34 in a plurality of pairs each comprising two rolls 34 arranged so as to vertically extend and be laterally opposite to each other are disposed in an electroplating tank 22 so as to extend in a longitudinal direction of the electroplating tank 22 along a line defined by connecting a substrate inlet 70 of the tank 22 and a substrate outlet 72 thereof to each other while being rendered rotatable about a vertical axis thereof, to thereby prevent shaking of a substrate being transferred. The rolls 34, as described above, are arranged so as to be rotatable about the vertical axis and spaced from each other laterally in a horizontal direction.

The electroplating apparatus of the illustrated embodiment also includes a seal structure for each of the substrate inlet 70 and substrate outlet 72 of the electroplating tank 22, which seal structure is constructed in such a manner as shown in FIG. 10. The substrate inlet 70 and substrate outlet 72 are constructed in a symmetric manner, therefore, the following description of the seal structure will be made on the outlet 72. A pair of rolls 34 round in section are arranged in the electroplating tank 22 so as to be in proximity to a portion of a wall of the electroplating tank 22 at which an opening for the outlet 72 is formed. The rolls 34 each are engaged with a squeegee 74 mounted on an inner surface of the wall in such a manner that the squeegee may be slidably contacted with a peripheral surface of each of the rolls 34 to provide liquid-tightness between the roll 34 and the squeegee 74. Also, the rolls 34 each are engaged at an upper end surface thereof with a seal plate 76 so that the seal plate 76 may be slidably contacted with the roll 34. The squeegee 74 and seal plate 76 cooperate with each of the rolls 34 to prevent leakage of an electroplating solution through the substrate outlet of the electroplating tank 22. The same is likewise applied to the substrate inlet 70 of the electroplating tank 22. An arrow in each of FIGS. 8 and 10 indicates a direction of transfer of the substrate.

In the electroplating apparatus of the illustrated embodiment constructed as described above, the substrate 36 is transferred in the electroplating tank 22 while being kept vertically hung by the clips 38, during which the substrate 36 being transferred is prevented from shaking and electrically connected to a cathode terminal of each of rectifiers 40. Feeding of electricity to insoluble anode plates 60 is selectively carried out depending on a size of the substrate 36 to be electroplated. More particularly, the feeding is carried out with respect to only insoluble anode plates 60 contained in a plane of projection of the substrate defined in a horizontal direction, so that a film of a uniform thickness may be deposited on the substrate.

Thus, electroplating on a substrate 36a of a large area is carried out while insoluble anode plates 60a to 60g contained in a plane of projection of the substrate 36a are kept electrically connected to anode terminals of the rectifiers 40, whereas that on a substrate 36b of a small area is carried out while keeping insoluble anode plates 60a to 60d contained in a plane of projection of the substrate 36b in the horizontal direction electrically connected to the anode terminals of the rectifiers 40, as shown in FIG. 9. Thus, the illustrated embodiment likewise permits a film of a uniform thickness to be formed on a whole surface of the substrate, to thereby effectively prevent an increase in thickness of the film, particularly, at a lower or second end of the substrate.

Now, the illustrated embodiment will be further described with reference to the following experimental examples and comparative examples.

Experimental Example 3

Sixteen insoluble anode plates 60 constructed in the same manner as those used in Experimental Example 1 described above were arranged in an electroplating apparatus constructed in such a manner as shown in FIGS. 8 and 9. Eight such insoluble anode plates 60 (60a to 60h) each were arranged so as to extend in a direction of transfer of the substrate on each of both sides of the rolls 34 in pairs while being kept laterally spaced by 12 cm from a center between the rolls 34 in each pair. The eight insoluble anode plates 60a to 60h thus arranged on each side of the rollers 34 in pairs were vertically spaced by a distance of 1 cm from each other in order and electrically connected through voltage/current regulators 9 to anode terminals of rectifiers 8, resulting in being fed with electricity independent from each other.

An electroplating solution of the following composition was prepared.

| | |
|---|---|
| Copper sulfate (CuSO$_4$.5H$_2$O) | 75 g/l |
| Sulfuric acid (H$_2$SO$_4$) | 180 g/l |
| Chlorine ion (Cl$^-$) | 60 mg/l |
| Brightener (CuBrite TH manufactured by EBARA-UDYLITE CO., LTD.) | 5 ml/l |

The electroplating solution was kept at a temperature of 24±2° C. and the other conditions were set to be the same as in Experimental Example 1.

Three kinds of substrates 36a, 36b and 36c were used as in Experimental Example 1, wherein electroplating on the substrate 36a was carried out while keeping the insoluble anode plates 60a to 60g connected to the anode terminals of the rectifiers 40, that on the substrate 36b was carried out while feeding the anode plates 60a to 60d with electricity, and that on the substrate 36c was carried out while keeping the anode plates 60a to 60c connected to the rectifiers 40.

A thickness of a film deposited on each of the substrates 36 and scattering of the thickness were measured as in Experimental Example 1. The results were as shown in Table 3. A thickness of a film electroplated on an end of the substrate was about 1.1 to 1.25 times as large as that on a central region of the substrate. Also, the film exhibited satisfactory appearance and properties sufficient to be put to practical use.

Comparative Example 3

Substrates 36a to 36c each were subject to electroplating while keeping an average current density of the substrate at 2.5 A/dm$^2$ and according to the conventional procedure wherein a voltage of the same level was applied to the insoluble anode plates 60a to 60g in pairs. The results were as shown in Table 3. Table 3 indicates that a thickness of a film deposited on a second end of the substrate opposite to a first end thereof held by clips 38 was about 3.3 times as large as that on a central region thereof, so that the film failed to exhibit satisfactory quality. Also, the film of the thus increased thickness on the end of the substrate was substantially coarse to a degree sufficient to cause an appearance and properties of the film to be highly deteriorated.

TABLE 3

| Substrate (Plating Area) (dm²) | Example | Anode Fed | Feed Conditions for Plating | | | Thickness of Film | | | Ratio of (b)/(a) |
| | | | Current per Pair of Laterally Adjacent Anodes (Amp) | Electricity Fed to Substrate (Amp) | Average Cathode Current Density (A/dm²) | First End(a) (μ) | Center (μ) | Second End(b) (μ) | |
| --- | --- | --- | --- | --- | --- | --- | --- | --- | --- |
| 36a (16.8 x2) | Exp. Example 3 | 60a −60g | 12.0 | 84.0 | 2.5 | 5.1 | 4.4 | 5.3 | 1.20 |
| | Comp. Example 3 | — | — | — | — | — | — | — | — |
| 36b (10.9 x2) | Exp. Example 3 | 60a −60d | 13.6 | 54.5 | 2.5 | 5.3 | 4.3 | 5.2 | 1.21 |
| | Comp. Example 3 | 60a −60g | 7.8 | 54.5 | 2.5 | 5.0 | 4.1 | 9.7 | 2.37 |
| 36c (8.3 x2) | Exp. Example 3 | 60a −60c | 13.8 | 41.3 | 2.5 | 5.3 | 4.5 | 5.1 | 1.13 |
| | Comp. Example 3 | 60a −60g | 5.9 | 41.3 | 2.5 | 5.1 | 4.3 | 11.7 | 2.72 |

Experimental Example 4

Electroplating on each of substrates 36a to 36c took place for 10 minutes while keeping an average current density of the substrate at 4.0 A/dm² and under the same conditions as in Experimental Example 3. Then, a thickness of a film formed on each of the substrates was measured. The results were as shown in Table 4, which indicates that the formed film was satisfactory. More particularly, a thickness of the film deposited on each of the first and second ends of the substrate was about 1.2 to 1.25 times as large as that on a central region of the substrate and exhibited good appearance and properties.

Comparative Example 4

Substrates 36a to 36c were subject to electroplating for 10 minutes according to the conventional procedure while keeping an average current density of the substrate at 4.0 A/dm² and under conditions shown in Table 4. The results were as shown in Table 4, which indicates that a thickness of a film deposited on a second end of the substrate opposite to a first end thereof held by clips 38 was about 2.0 to 2.7 times as large as that on a central region of the substrate, to thereby cause the substrate having the film deposited thereon to be unsuitable for use. Also, the film deposited on the end of the substrate was substantially coarse to a degree sufficient to cause an appearance and properties of the film to be substantially deteriorated.

As can be seen from the foregoing, the electroplating apparatus of the present invention is so constructed that an area of the insoluble anode plates to be fed with electricity is adjusted depending on a size of the thin sheet. Such construction permits a film of a uniform thickness to be electroplated on the thin sheet irrespective of a size of the thin sheet. Also, in the electroplating apparatus of the present invention which uses the insoluble anode plates, a concentration of metal ingredients in the electroplating solution may be readily maintained at a desired level by merely charging soluble salts of the metal ingredients in the electroplating solution. Further, the present invention is constructed so as to eject the electroplating solution in a direction perpendicular to a direction of transfer of the thin sheet being transferred, resulting in enhancing throwing power in electroplating with respect to through-holes of the thin sheet.

While preferred embodiments of the invention have been described with a certain degree of particularity with reference to the drawings and examples, obvious modifications and variations are possible in light of the above teachings. It is therefore to be understood that within the scope of the appended claims, the invention may be practiced otherwise than as specifically described.

What is claimed is:

1. An electroplating apparatus comprising:
   an electroplating tank for receiving an electroplating solution, said electroplating tank defining a transfer passage
   transfer means for transferring a substantially thin sheet to be electroplated along said transfer passage in said electroplating tank;

TABLE 4

| Substrate (Plating Area) (dm²) | Example | Anode Fed | Feed Conditions for Plating | | | Thickness of Film | | | Ratio of (b)/(a) |
| | | | Current per Pair of Laterally Adjacent Anodes (Amp) | Electricity Fed to Substrate (Amp) | Average Cathode Current Density (A/dm²) | First End(a) (μ) | Center (μ) | Second End(b) (μ) | |
| --- | --- | --- | --- | --- | --- | --- | --- | --- | --- |
| 36a (16.8 x2) | Exp. Example 4 | 60a −60g | 19.3 | 135 | 4.0 | 8.4 | 7.0 | 8.6 | 1.23 |
| | Comp. Example 4 | — | — | — | — | — | — | — | — |
| 36b (10.9 x2) | Exp. Example 4 | 60a −60d | 21.8 | 87 | 4.0 | 8.6 | 6.9 | 8.3 | 1.20 |
| | Comp. Example 4 | 60a −60g | 12.7 | 87 | 4.0 | 8.2 | 7.2 | 14.2 | 1.97 |
| 36c (8.3 x2) | Exp. Example 4 | 60a −60c | 22.0 | 66 | 4.0 | 8.2 | 6.6 | 8.0 | 1.21 |
| | Comp. Example 4 | 60a −60g | 9.5 | 66 | 4.0 | 7.9 | 6.8 | 18.3 | 2.69 | a plurality of insoluble anode plates arranged in a plurality of pairs in said electroplating tank so as to extend along said transfer passage;

in each said pair said insoluble anode plates being arranged so as to be spaced from each other at a predetermined interval with said transfer passage being interposed therebetween;

in each said pair said insoluble anode plates being arranged to be electrically independent from each other;

said insoluble anode plates in said pairs being juxtaposed to each other in a direction substantially perpendicular to said transfer passage electricity feeding means for independently feeding electricity to said insoluble anode plates of each said pair, said electricity feeding means being adapted to feed electricity to a predetermined number of said pairs of the insoluble anode plates according to a size of said substantially thin sheet to be electroplated; and an electrical connection means for electrically connecting the substantially thin sheet to said electricity feeding means;

whereby electroplating on the substantially thin sheet is carried out by feeding electricity to only the pairs of said insoluble anode plates contained in a plane of projection of the substantially thin sheet defined in a direction substantially perpendicular to a surface of the substantially thin sheet being transferred.

2. An electroplating apparatus as defined in claim 1, wherein said transfer means comprises a multiplicity of pairs of rollers, said substantially thin sheet being transferred while being held between the rollers in each said pair of rollers rotated in directions opposite to each other.

3. An electroplating apparatus as defined in claim 2, wherein said electrical connection means comprises clips mounted on a conductive chain so as to grasp the thin sheet.

4. An electroplating apparatus as defined in claim 1, wherein said transfer means further comprises a conductive chain and clips mounted on said conductive chain so as to grasp said substantially thin sheet.

5. An electroplating apparatus as defined in claim 4, wherein said transfer means functions as said electrical connection means.

6. An electroplating apparatus as defined in claim 4, further comprising a manipulating means for opening and closing said clips arranged at an end of said transfer passage.

7. An electroplating apparatus as defined in claim 6, wherein said manipulating means comprises a guide member having a cam surface formed thereon, and
each said clip includes a clip body, a clamp element being mounted on and movable relative to said clip body and a biasing member being adapted to hold the substantially thin sheet between said clip body and said clamp element, whereby each said clip is opened when said clip body is in contact with said cam surface of said guide member.

8. An electroplating apparatus as defined in claim 7, wherein said cam surface of said guide member includes a slant portion slanted with respect to the direction of transfer of the substantially thin sheet.

9. An electroplating apparatus as defined in claim 1, wherein said electrical connection means further comprises clips mounted on a conductive chain so as to grasp said substantially thin sheet.

10. An electroplating apparatus as defined in claim 4, further comprising a manipulating means for opening and closing said clips arranged at an end of said transfer passage.

11. An electroplating apparatus as defined in claim 10, wherein said manipulating means comprises a guide member having a cam surface formed thereon, and
each of said clips includes a clip body, a clamp element mounted on and movable relative to said clip body and a biasing member so as to hold the substantially thin sheet between said clip body and said clamp element, whereby each said clip is opened when said clip body being in contact with said cam surface of said guide member.

12. An electroplating apparatus as defined in claim 11, wherein said cam surface of said guide member includes a slant portion slanted with respect to the direction of transfer of the thin sheet.

13. An electroplating apparatus as defined in claim 1, further comprising a circulation pump for circulating said electroplating solution;
said circulation pump being provided on an outlet side thereof with a discharge pipe provided with a jet nozzle for ejecting said electroplating solution toward said transfer passage.

14. An electroplating apparatus as defined in claim 1, wherein said electroplating solution is charged with a soluble salt of a metal ingredient of said electroplating solution to replenish ions of said metal ingredient consumed by electroplating.

15. An electroplating apparatus comprising:
an electroplating tank for receiving an electroplating solution said electroplating tank defining a transfer passage;
transfer means for transferring a substantially thin sheet to be electroplated along said transfer passage in said electroplating tank while keeping the substantially thin sheet substantially horizontally;
a plurality of pairs of insoluble anode plates arranged in said electroplating tank so as to extend along said transfer passage;
each said pair of insoluble anode plates being arranged to be substantially vertically spaced from each other at a predetermined interval with said transfer passage being interposed therebetween;
in each said pair said insoluble anode plates being arranged to be electrically independent from each other;
said insoluble anode plates in said pairs being juxtaposed to each other in a direction substantially perpendicular to said transfer passage
electricity feeding means for independently feeding electricity to each said pair of insoluble anode plates, said electricity feeding means being adapted to feed electricity to a predetermined number of said pairs of the insoluble anode plates according to a size of said substantially thin sheet to be electroplated; and
electrical connection means for electrically connecting said substantially thin sheet to said electricity feeding means;
whereby electroplating on said substantially thin sheet is carried out by feeding electricity only to the pairs of insoluble anode plates contained in a plane of projection of the substantially thin sheet defined in a substantially vertical direction of the transferred substantially thin sheet.

16. An electroplating apparatus comprising:

an electroplating tank for receiving an electroplating solution, said electroplating tank defining a transfer passage;

transfer means for transferring a substantially thin sheet to be electroplated along said transfer passage in said electroplating tank while keeping the substantially thin sheet essentially vertically;

a plurality of insoluble anode plates arranged in a plurality of pairs in said electroplating tank so as to extend along said transfer passage;

in each said pair said insoluble anode plates being arranged to be laterally spaced from each other at a predetermined interval with said transfer passage being interposed therebetween;

said insoluble anode plates in each said pair being arranged to be electrically independent from each other;

said insoluble anode plates in said pairs being juxtaposed to each other in a direction substantially perpendicular to said transfer passage.

an electricity feeding means for independently feeding electricity to said insoluble anode plates of each said pair; and an electrical connection means for electrically connecting the substantially thin sheet to said electricity feeding means;

whereby electroplating on the substantially thin sheet is carried out by feeding electricity only to the insoluble anode plates contained in a plane of projection of the substantially thin sheet defined in a horizontal direction of the substantially thin sheet being transferred.

17. An electroplating apparatus comprising:

an electroplating tank for receiving an electroplating solution, said electroplating tank defining a transfer passage;

transfer means for transferring a substantially thin sheet to be electroplated along said transfer passage in said electroplating tank, said transfer means comprises a multiplicity of pairs of rollers, said substantially thin sheet being transferred while being held between said rollers in each said pair of rollers rotated in directions opposite to each other;

a plurality of insoluble anode plates arranged in a plurality of pairs in said electroplating tank so as to extend along said transfer passage;

in each said pair said insoluble anode plates being arranged so as to be spaced from each other at a predetermined interval with said transfer passage being interposed therebetween;

in each said pair said insoluble anode plates being arranged to be electrically independent from each other;

said insoluble anode plates in said pairs being juxtaposed to each other in a direction substantially perpendicular to said transfer passage;

an electricity feeding means for independently feeding electricity to said insoluble anode plates of each said pair; and an electrical connection means for electrically connecting said substantially thin sheet to said electricity feeding means;

whereby electroplating on said substantially thin sheet is carried out by feeding the electricity only to the pairs of said insoluble anode plates contained in a plane of projection of said substantially thin sheet defined in a direction substantially perpendicular to a surface of the substantially thin sheet being transferred.

* * * * *

UNITED STATES PATENT AND TRADEMARK OFFICE
CERTIFICATE OF CORRECTION

PATENT NO.  : 5,441,619
DATED       : August 15, 1995
INVENTOR(S) : Kawachi et al.

It is certified that error appears in the above-identified patent and that said Letters Patent is hereby corrected as shown below:

Column 4, line 2 "46to" should read --46 to--.

Column 6, line 28 before "an" insert --The electroplating solution thus prepared was charged in--.

Column 6, line 46 "6Oh," should read --60h,--.

Column 10, line 13 "6Oh)" should read --60h)--.

Column 14, line 3 after "claim" change "4" to --9--.

Signed and Sealed this

Twelfth Day of December, 1995

Attest:

BRUCE LEHMAN

*Attesting Officer*       *Commissioner of Patents and Trademarks*